(12) United States Patent
Li

(10) Patent No.: US 6,333,208 B1
(45) Date of Patent: Dec. 25, 2001

(54) ROBUST MANUFACTURING METHOD FOR MAKING A III-V COMPOUND SEMICONDUCTOR DEVICE BY MISALIGNED WAFER BONDING

(76) Inventor: Chiung-tung Li, 6851 Blake St., El Cerrito, CA (US) 94530

( * ) Notice: Subject to any disclaimer, the term of this patent is extended or adjusted under 35 U.S.C. 154(b) by 0 days.

(21) Appl. No.: 09/395,447

(22) Filed: Sep. 14, 1999

Related U.S. Application Data

(60) Provisional application No. 60/143,447, filed on Jul. 13, 1999.

(51) Int. Cl.[7] .................................................. H01L 21/44
(52) U.S. Cl. ........................ 438/107; 438/455; 438/458; 438/604
(58) Field of Search .................................... 438/106, 107, 438/604, 455, 457, 458, 459

(56) References Cited

U.S. PATENT DOCUMENTS

| | | | |
|---|---|---|---|
| 4,261,781 | 4/1981 | Edmonds et al. | 156/254 |
| 4,707,216 | * 11/1987 | Morkoc et al. | 156/610 |
| 4,928,438 | 5/1990 | Narimatsu et al. | 51/283 |
| 5,244,830 | 9/1993 | Kang et al. | 437/132 |
| 5,346,848 | 9/1994 | Grupen-Shemansky et al. | 437/61 |
| 5,661,316 | 8/1997 | Kish, Jr. et al. | 257/190 |
| 5,714,029 | 2/1998 | Uemura et al. | 156/275.5 |
| 5,893,746 | 4/1999 | Usami et al. | 438/455 |

OTHER PUBLICATIONS

McHatton, et al., "Eliminating Backgrind Defects with Wet Chemical Etching", Solid State Technology, Nov. 1988.
Sickmiller, et al., "Packaging of Ultra-Thin Film GaAs Devices for Increased Thermal Eficiency and High Density MCM's", 1999 GaAs Mantch.
Torrance, et al., "Wax Mounting, Backlapping and Chemo-Mechanical Polishing of 150 mm (6 Inch) GaAS Wafers", 1999 GaAs Mantech.
Brochure entitled "Tapetronics".
Brochure entitled "ICROS Tape".
R.E. Williams, "Modern GaAs Processing Methods", Artech House, 1990, pp. 319–331.
Grupen–Shemansky et al., "A Novel Wafer Thinning Process for GaAS or Si", 1994 GaAs Mantech Conference.

* cited by examiner

Primary Examiner—Charles Bowers
Assistant Examiner—Lynne Gurley

(57) ABSTRACT

A first III-V semiconductor wafer is bonded to a second III-V semiconductor wafer, e.g. by thermal fusion. The {110} crystal plane of the III-V semiconductor wafer is displaced angularly relative to the {110} crystal plane of the second III-V semiconductor wafer. Because of this, the tendency of the bonded wafer to break is reduced and many backside processes can be moved to front side and results in a robust device manufacturing process.

23 Claims, 3 Drawing Sheets

ROBUST MANUFACTURING METHOD FOR MAKING A III-V COMPOUND SEMICONDUCTOR DEVICE BY MISALIGNED WAFER BONDING

This Application claims priority based on my U.S. Provisional Patent Application No. 60/143,447, filed Jul. 13, 1999.

BACKGROUND OF THE INVENTION

This invention relates to the manufacture of large diameter III-V compound semiconductor wafers used to make semiconductor devices such as FETs (field effect transistors), HBTs (heterojunction bipolar transistors) and MMICs (monolithic microwave integrated circuits).

Among III-V semiconductor compounds, GaAs is most prominent. There has been more extensive device and IC development work and manufacturing infrastructure for GaAs than any other III-V compound semiconductor. Some GaAs devices are in direct competition against silicon devices for application in the commercial market. While much of the discussion below is directed to GaAs, it can also be applied to other III-V compound semiconductors because these other compounds have the same zencblende crystal structure, and have physical and chemical characteristics similar to GaAs.

GaAs, as well as other III-V semiconductor wafers, are much more fragile than silicon wafers. Thus, wafer breakage during device manufacturing is one of the cost disadvantages of GaAs devices and ICs compared to silicon. Another disadvantage of GaAs is that sizes of GaAs wafers available for manufacturing are far smaller than silicon wafers. Currently, the largest size of GaAs wafer available is increasing from 100 mm to 150 mm. However, this increase in wafer size exacerbates the wafer breakage problem.

The density of GaAs is 2.28 times that of silicon. Therefore, a GaAs wafer having a size comparable to a silicon wafer will have more than twice the weight of the silicon wafer. Because such GaAs wafers are more fragile than silicon wafers, and because such GaAs wafers are heavier than silicon wafers, most of the processing machinery originally designed to process silicon wafers may have to be modified if it is used to handle GaAs wafers. Such modifications are generally directed toward slowing the motion of wafers inside the equipment to minimize the likelihood of wafer breakage.

Because GaAs is much denser than silicon, increasing the GaAs thickness to enhance wafer strength is impractical. Further, because of the fracture mechanism of a GaAs single crystal wafer (as well as other III-V semiconductor wafers), making the wafer thicker does not always increase the strength of the wafer proportionally against breakage. This is because III-V semiconductor wafers cleave very easily along {110} crystal planes. The cleavage can be initiated from mechanical surface defects, such as scratches from wafer processing or intrinsic material flaws, such as micro voids. A small crack is first formed from these defects or flaws on one of the {110} planes which has the smallest cross section (i.e. one of the {110} planes perpendicular to the wafer surface). The crack then propagates along the {110} plane in response to repeated mechanical impacts and thermal cycling that wafer is subjected to during device processing. The wafer breaks apart when the crack along the {110} plane extends across the whole wafer. When that occurs, it occurs most often when the wafer is handled kinetically, e.g. transferring the wafer between cassettes or between a cassette and a machine. If the wafer breaks inside a machine, this not only destroys the wafer, but also may force the shut down of the machine.

After fabrication of devices such as FETs, HBTs and MMICs is done on front side of wafer (the so-called "front side process" in the industry), wafer backside processing follows. The first step of backside processing is wafer thinning by grinding followed by wet chemical etching on the backside of wafer. See, for example, R. E. Williams, "Modern GaAs Processing Methods", published by Artech House in 1990; and Grupen-Shemansky, et al., "A Novel Wafer Thinning Process for GaAs or Si", 1994 GaAs MAN-TECH Conference, pp. 167–170. Although a GaAs wafer is more fragile than silicon, a GaAs wafer needs to be thinned to about 0.1 mm or even 0.03 mm, compared to 0.2 mm to 0.3 mm typically used for silicon wafers. The main reason for such thin GaAs device wafers is that the thermal conductivity of GaAs is only ¼ that of silicon. Another reason is that a thin and precise semi-insulating GaAs substrate thickness is a result of design optimization for strip-line microwave transmission impedance of a MMIC.

A rigid wafer support and front side protection has been developed to aid in the GaAs wafer backside thinning process. See R. E Williams above and Norman, et al., "Substrate Mounting for Wafer Thinning or Substrate Removal, New Technique Factors", 1992 GaAs Mantech, p. 19–22. To obtain sufficient accuracy in thickness and uniformity, great care is needed during the thinning process.

After wafers are thinned, there are three choices of backside processes before the wafer is scribed and separated into individual devices/ICs:

1. One can do no such additional backside processing if the device/IC will be attached to a metal carrier by an epoxy bond.
2. One can deposit metal on the wafer backside if the device/IC will be attached to a circuit by a solder bond.
3. One can etch small holes extending from the backside of the device/IC to the front side and then deposit metal in the holes to connect device ground (on the front side of the wafer) to the backside metal. This third backside process requires many steps including photo-resist spin and bake, an infrared ("IR") contact mask to align a mask on one side of the wafer with structures on the other side of the wafer (see R. E. Williams as cited above), and reactive ion etching ("RIE"). To avoid processing these steps on thin and fragile GaAs, it has been proposed to move these processing steps to front side. See Furukawa et al "A Novel Fabrication Process of Surface Via-Holes for GaAs Power FETS", Tech. Dig. 1998 GaAs IC Symposium, pp251–254, and Ishikawa et al., "A High-Power GaAs FET Having Buried Plated Heat Sink for High Performance MMICs", IEEE Trans. Electron Devices, Vol. 41, No. 1, 1994, pp. 3–9.) However, this is at a tradeoff cost of requiring a precisely controlled etched hole depth. When using this process, one still cannot avoid the requirement of precise control during backside thinning.

In summary, GaAs wafers are more fragile than silicon. Therefore, the wafers must be handled with greater care. This makes backside processing more complex and difficult.

SUMMARY

A method for reducing the likelihood of a III-V compound semiconductor wafer breaking comprises the step of bonding first and second wafers together. Of importance, the {110} cleavage planes in the first wafer perpendicular to the surface of the first wafer are not aligned to any of the {110} planes in the second wafer perpendicular to the surface of second wafer. (The symbol {110} refers to a family of equivalent crystallographic planes. For example, the (110), (101), (011), (110), (110), etc. are all members of this family of planes.) The angle of misalignment between such {110} planes in two wafers is preferably the maximum allowed by the nature of the zencblende crystal in III-V compounds to maximize the benefit of misalignment in strengthening the bonded wafer to prevent cleavage.

In a preferred embodiment of bonding two wafers with same crystal surface orientation, e.g. a (100) orientation, every {110} plane in the first wafer perpendicular to the surface of the first wafer is misaligned by about a 45° angle with respect to any corresponding {110} plane in the second wafer.

In another embodiment, two wafers with different crystal surface orientations, e.g. an orientation of (100) for one wafer and (111) for the second wafer, are bonded together. The maximum effective misalignment between two (011) planes in the two wafers is 15°. Because the {110} planes perpendicular to the wafer surface in the two wafers are misaligned, cleavage along one {110} plane of one of the wafers will not propagate to the second wafer's {110} plane, and the bonded wafers will exhibit a reduced tendency to break.

The preferred bonding technique is high temperature (400 to 1000° C.) wafer fusion bonding to achieve mechanical strength against wafer separation. (Fusion bonding has been successfully achieved in GaAs, InAs, GaP, InP and epitaxial grown surface films of ternary and quaternary III-V compounds. See Okuno et al, "Direct Wafer Bonding of III-V Compound Semiconductors for Free-Material and free-Orientation Integration" IEEE J. of Quantum Electronics, Vol. 33, No, 6, 1997.) The first and second wafers can be any combination of two different III-V compound semiconductors, but are preferably made of the same III-V compound. Because of this, their coefficients of thermal expansion match, and thermal stress introduced into the wafers during processing should be minimized, which is advantageous during device and device processing.

Electronic devices, such as transistors and MMICs, are typically formed in semi-insulating material in the first wafer after bonding. Thereafter, the second wafer and part of the first wafer can be removed, first by mechanical grinding followed by chemical etching to reduce the wafers to the final device/IC substrate thickness. Unique to III-V semiconductor device fabrication, selective wet etching or dry etching is widely used in device manufacturing. The wafer fusion bond structure can be used to take the advantage of these selective etch properties in III-V semiconductors for a robust backside process. Since the second wafer provides mechanical support, the first wafer (the device wafer) is polished to device substrate thickness (e.g. 0.03 mm to 0.15 mm ) prior to front side device processing. During backside processing, the second wafer is selectively etched off by one of two techniques:

1. Select a material for the second wafer that can be selectively etched against the first wafer. In other words, the second wafer material has a substantially greater etch rate than the first wafer material. (This difference in etch rate can be accomplished, for example, by doping one of the wafers with an impurity, or using completely different wafer materials.)
2. Provide a thin (e.g., 30 to 100 nm) etch stop layer on the bonding surface of either the first or second wafers before wafer bonding. In one embodiment, this etch stop layer can be epitaxially grown on the bonding surface prior to bonding. Etching of the second wafer stops at etch stop layer. Then, the thin etch stop layer is etched off in a second selective etching step. The second bonded wafer and etch stop layer combined with the use of a selective etching process can be used advantageously to provide a high yield via hole process in front side of the wafer.

DETAILED DESCRIPTION

Figure 1:
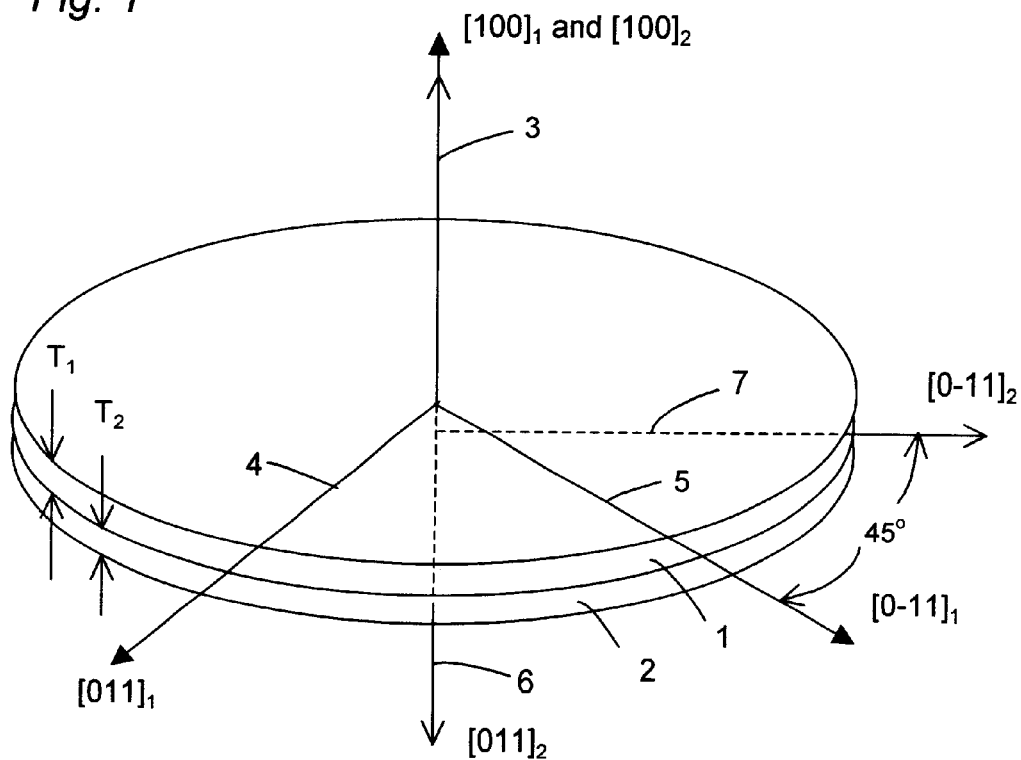
FIG. 1 illustrates first and second III-V semiconductor wafers bonded together in accordance with a first embodiment of my invention.

FIG. 1 illustrates a first (100) III-V semiconductor wafer 1 bonded to second (100) III-V semiconductor wafer 2. Wafers 1 and 2 are typically GaAs, but other III-V semiconductor materials can be used as well. The (100) crystal directions of first and second wafers are shown by arrow 3. Also shown in FIG. 1 are the directions of (011) crystal plane for wafer 1 (arrow 4) and (011) crystal plane (arrow 5). Arrows 6 and 7 show equivalent {110} crystal planes in (100) wafer 2. These {110} planes are perpendicular to the surface of (100) wafers 1 and 2. The angle between the planes represented by arrows 4 and 5 is 90°. Similarly, the angle between the planes represented by arrows 6 and 7 is 90°. Therefore, a maximum effective rotational misalignment between two sets of {110} planes in wafers 1 and 2 is 45°, i.e. one half of 90°.

An effective rotational misalignment $\phi$ is given because for any actual angle of rotation $\theta$ of wafer 1 with respect to wafer 2, there can only be an effective rotational misalignment $\phi$ that is between 0 and 45°. This effective rotational misalignment $\phi$ repeats within each quadrant of rotation. Thus, if wafer 1 is rotated by an angle $\theta=40°$, that produces the same effective rotational misalignment $\phi$ as if wafer 1 were rotated by an angle $\theta=50°$. Because of the four-fold symmetry of {110} planes in (100) wafers, there are a total of eight equivalent angles of rotation $\theta$ for each effective rotational misalignment $\phi$. These equivalent angles of rotation $\theta$ are $\theta=\pm\phi+n90°$, where n is any integer. For a given angular rotation $\theta$ of wafer 1 with respect to wafer 2, the effective rotational misalignment $\phi$ equals abs($\theta\pm n90°$) for that integer n that produces a value of $\phi$ between 0 and 45°. ("abs" refers to the absolute value.) Another way of stating this relationship is that $\phi=\theta$ modulus 90° if $\theta$ modulus 90° is less than or equal to 45°; otherwise, $\phi=90°-(\theta$ modulus 90°). If wafer 1 is rotated by an angle $\theta$ that is an integral multiple of 90°, the effective rotational misalignment $\phi$ is zero.

FIG. 1 illustrates one of the maximum effective rotational misalignments of wafer 1 with respect to wafer 2, i.e. misalignment by 45°. Specifically, wafer 1 (or arrow 4) is rotated clockwise with respect to wafer 2 (or arrow 6) by 45°.

In an alternate embodiment of my invention, two (111) wafers 1 and 2 are bonded together. The angle between any two of the (011), (101) and (110) cleavage planes (the {110} planes which are perpendicular to the (111) wafer surface) is 60° and the crystal symmetry is six fold. The maximum effective rotational misalignment, $\phi_{max}$ is thus 30°. When bonding two (111) wafers together. The effective rotational misalignment, $\phi$, is calculated by the equation $\phi=abs(\theta\pm n60°)$ for that integer n which provides a value of $\phi$ between 0 and 30°. Another way of stating this relationship is that $\phi=\theta$ modulus 60° if $\theta$ modulus 60° is less than or equal to 30°; otherwise, $\phi=60°-(\theta$ modulus 60°). The equivalent angles of rotation $\theta$ for an effective rotational misalignment $\phi$ are $\theta=\pm\phi+n60°$ where n is any integer. There are a total of twelve equivalent angles of rotation $\theta$ that can produce a given effective misalignment angle $\phi$ when bonding two (111) wafers.

Figure 2:
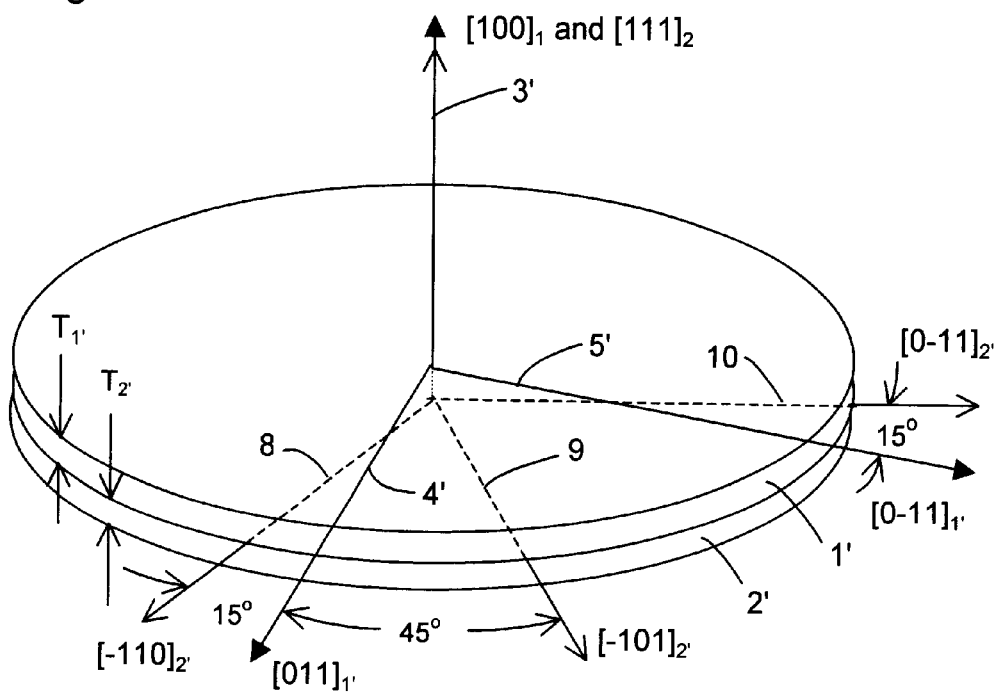
FIG. 2 illustrates first and second III-V semiconductor wafers bonded together in accordance with a second embodiment of my invention.

FIG. 2 shows a second embodiment of my invention in which two wafers with different surfaces, (100) in wafer 1' and (111) in wafer 2', are bonded together. Directions of the (011) and ($0\bar{1}1$) planes in wafer 1' are represented by arrows 4' and 5', respectively. Directions of the ($\bar{1}10$), ($\bar{1}01$) and (0$\bar{1}1$) planes in wafer 2' are represented by arrows 8, 9 and 10, respectively. There is only one {110} cleavage plane from each wafer that can be aligned. If the ($0\bar{1}1$) planes from wafer 1' and wafer 2' are aligned (0° of rotation between arrows 5' and 10), the angle between the (011) plane (arrow 4') in wafer 1' and the ($\bar{1}10$) plane (arrow 8) and ($\bar{1}01$) plane (arrow 9) in wafer 2' is 30°. Therefore, 30° rotation will align the (011) plane (arrow 4') in wafer 1' with either the ($\bar{1}10$) plane (arrow 8) or the ($\bar{1}01$) plane (arrow 9) in wafer 2'. 60° of rotation will align the ($0\bar{1}1$) plane (arrow 5') in wafer 1' with either the ($\bar{1}10$) plane (arrow 8) or the ($\bar{1}01$) plane (arrow 9) in wafer 2'. The maximum effective rotational misalignment between (100) and (111) wafers 1' and 2', $\phi_{max}$, is thus 15°. The equivalent angles of rotation $\theta$ between wafers 1' and 2' for an effective rotational misalignment angle, $\phi$, are $\theta=\pm\phi+n30°$, where n is any integer. For a given rotational angle $\theta$, the effective rotational misalignment is $\phi=abs(\theta\pm n30°)$ for that integer n that produces a value of $\phi$ between 0 and 15°. Another way of stating this relationship is that $\phi=\theta$ modulus 30° if $\theta$ modulus 30° is less than or equal to 15°; otherwise, $\phi=30°-(\theta$ modulus 30°).

FIG. 2 illustrates one of the maximum effective rotational misalignments of wafer 1 with respect to wafer 2, i.e. misalignment by 15°. Specifically, wafer 1 (or arrow 5') is rotated clockwise with respect to wafer 2 (or arrow 10) by 15°.

Wafers 1 and 2 are preferably bonded together by thermal fusion at temperature between about 400 and 100° C. The technology of high temperature wafer fusion bonding is well established in manufacturing. Equipment for manufacturing can be purchased from Karl Suss, and Electronic Visions Co. Selection of a fusing temperature depends on the subsequent highest process temperature that the bonded wafers will be exposed to. For example, if wafer 1 will be subjected to ion implantation and an annealing process at a temperature of 700 to 850° C., the fusion temperature may be as high as 900° C. If wafer 1 will be used for epitaxial layer growth in a molecular beam epitaxial machine (e.g. a growth temperature of about 650° C.), a fusion temperature of 700° C. may suffice for bonding wafer 1 and 2. (I prefer to ensure that the bonding temperature is greater than or equal to the highest processing temperature that wafers 1 and 2 are subsequently subjected to.)

Top wafer 1 is used for device fabrication using conventional GaAs IC manufacturing techniques. Typical materials for wafer 1 are (100) semi-insulating GaAs or InP. Bottom wafer 2 is provided first for mechanical strengthening purposes. The thickness of wafer 2 is in range of 0.3 to 0.6 mm. Wafer 2 is removed completely during the backside process. Alternatively, wafer 2 can be used to assist in the backside process as discussed below.

Figure 3A:
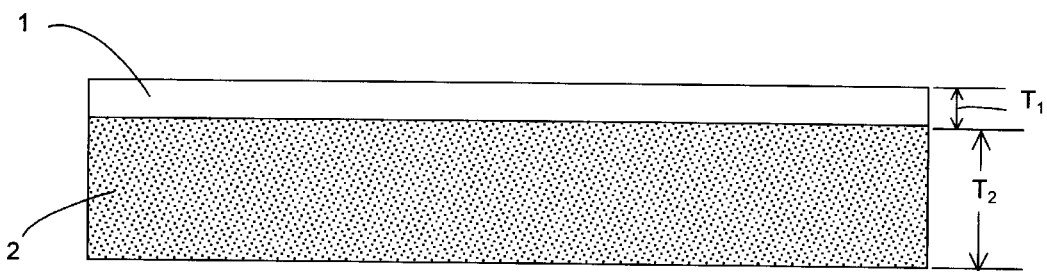
FIGS. 3A to 3D illustrate the manufacturing of a transistor on a pair of bonded wafers in accordance with one embodiment of my invention.

FIGS. 3A to 3D show the use of bonded wafers to assist backside processing. In this embodiment, a p$^+$ conducting GaAs wafer 2 and a semi-insulating (100) GaAs wafer 1 are fusion bonded according to first or second embodiment (FIGS. 1 or 2). FIG. 3A shows that with wafer 2 supporting wafer 1, wafer 1 is polished to a thickness $T_1$ (0.15 to 0.03 mm). This thickness is appropriate for forming devices in wafer 1.

Figure 3B:
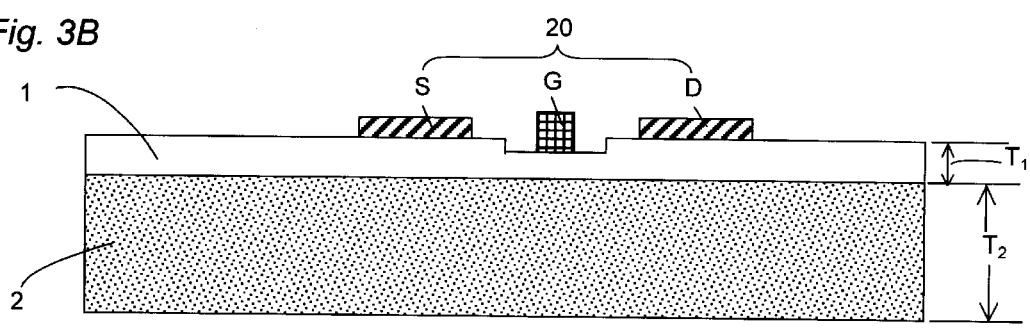
Figure 3C:
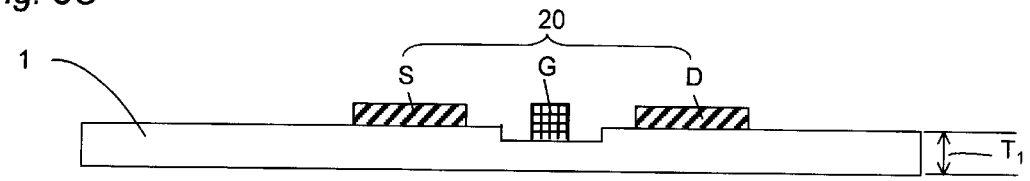

FIG. 3B shows that devices, such as FET 20 for example, are fabricated in wafer 1 during front side processing. (As shown in FIG. 3B, FET 20 comprises a source S, a drain D and a gate G.) During backside processing, wafer 2 is partially removed, first by mechanical means, such as backgrinding or lapping, for high removing rate. This can be done in a manner similar to that described by the Grupen-Shemansky or R. E. Williams references, described above. Thereafter, the remaining portion of wafer 2 is etched off using an anodic etching technique as shown in FIG. 3C. This can be done using a technique as described by Nuese, et al., "Electrolytic Removal of P-Type GaAs Substrates from Thin, n-type Semiconductor Layers", J. Electrochem. Soc. Vol. 117, No. 8, 1970, pp1094–1097.

Figure 3D:
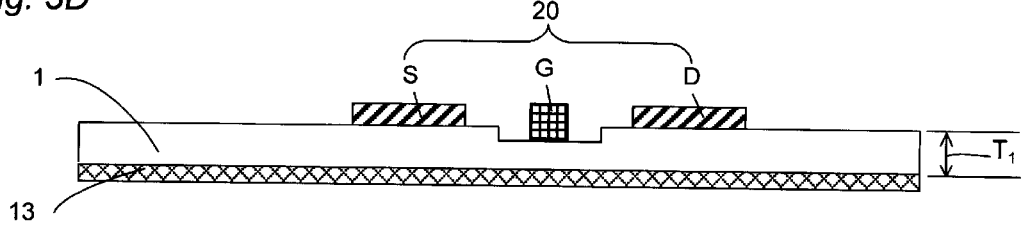

FIG. 3D shows that an optional backside metallic layer 13, such as Ti/Au, is deposited on the bottom side of wafer 2. After deposition of layer 13, wafer 1 is sawed or scribed and separated to individual devices or ICs.

Figure 4A:
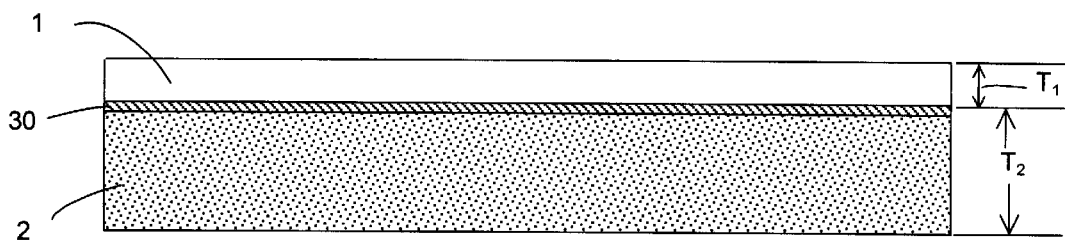
FIGS. 4A to 4D illustrate the manufacture of a transistor with a backside contact via hole on a pair of bonded wafers in accordance with another embodiment of my invention.
Figure 4B:
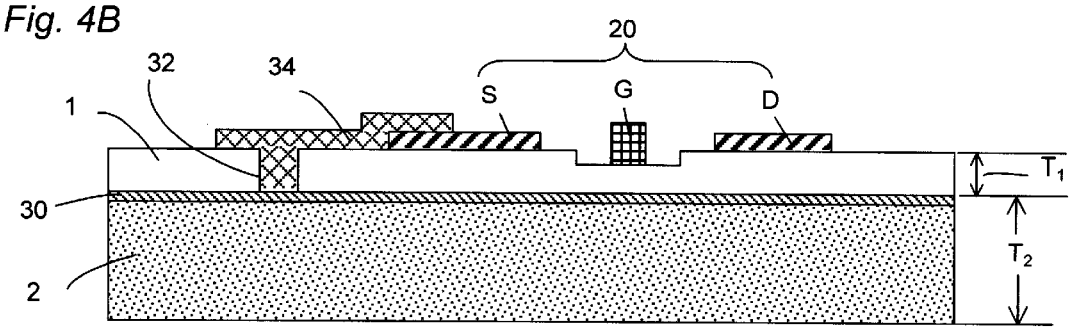
Figure 4C:
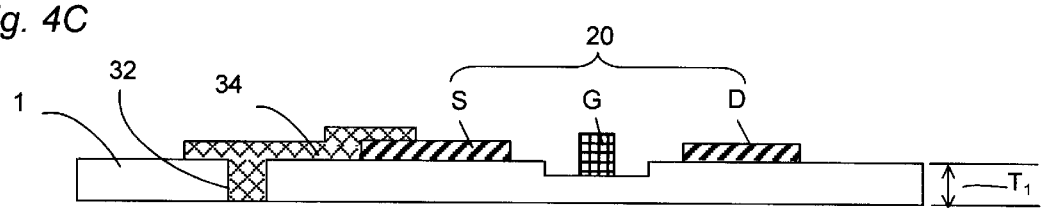

FIGS. 4A to 4D show a fourth embodiment of a bonded wafer assisting backside processing. During this processing, a via hole is provided. A thin (30 to 100 nm) etch stop layer 30 is sandwiched between (100) semi-insulating GaAs wafer 1 and any GaAs wafer 2. (The wafers can be oriented in accordance with the first or second embodiments.) The etch stop layer 30 is III-V compound semiconductor alloy such as $Al_xGa_{1-x}As$ (0.03<x<1) which, prior to wafer bonding, is epitaxially grown on one bonding surface using MBE or MOCVD technique. Alternatively, etch stop layer 30 can be grown by a liquid epitaxial technique using the following steps. A thin layer of Al is deposited, prior to wafer bonding, on one bonding surface of one of the wafers. Thereafter, the two wafers are bonded at a temperature much higher than the melting point of Al (660° C.) to dissolve part of the GaAs into the molten Al layer. Dissolved GaAs precipitates in a $Al_xGa_{1-x}As$ alloy during wafer cooling and epitaxially grows on the GaAs surfaces. With wafer 2 supporting wafer 1, wafer 1 is polished to a thickness $T_1$ (0.15 to 0.03 mm). (Thickness $T_1$ is appropriate for forming devices such as FETs, HBTs or ICs.) Devices such as FETs (e.g. FET 20) and ICs are fabricated in wafer 1 during front-side processing. Also during front-side processing, a via 32 is etched through wafer 1. When etch stop layer 30 (at depth $T_1$ below the surface of wafer 1) is reached, the via hole etching process is stopped. Etch stop layer 30 ensures the etched via hole using selective etching stops at etch stop layer 30. The etched via hole 32 is covered with a conductive layer such as thick Au 34 and connected to a device such as FET 20, e.g. by the combination of sputtering or electroless plating followed by electroplating (see Furukawa et al cited above). During backside processing, wafer 2 is removed partially first by mechanical means, such as backgrinding or lapping, for a high removal rate. The remaining portion of wafer 2 is etched off with a selective wet etchant, which etches GaAs, but etches only a small amount of $Al_xGa_{1-x}As$ (0.03<x<1) etch stop layer 30. Etch stop layer 30 is then etched off with second selective etchant, which etches $Al_xGa_{1-x}As$ ($0.03<x<1$) rapidly compared to GaAs. Results from these selective etches are shown in FIGS. 4A to 4C.

Figure 4D:
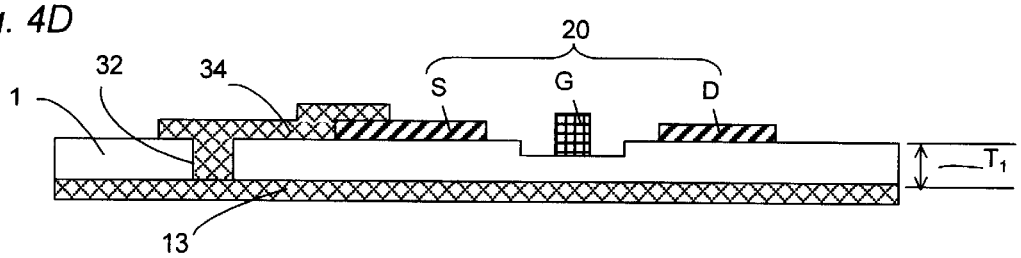

Thereafter, a metallic layer 13, such as Ti/Au, is deposited on the bottom side of wafer 2 as shown in FIG. 4D. Then wafer is sawed or scribed and separated to individual device or IC chip. Of importance, a voltage such as ground can be applied to transistor 20 via the carrier that device or IC chip is mounted on and through the Ti/Au 13 and thick Au 34.

In summary, bonding two wafers in the manner described above results in a stronger, more mechanically robust III-V semiconductor wafer than a single crystal wafer with same thickness. Further, bonding two wafers offers an opportunity to simplify III-V semiconductor backside processing by combining two materials different in etching characteristics or inserting a thin etch stop layer between two wafers. With a stronger bottom wafer (wafer 2) in support, it is easier to thin the top device wafer to an appropriate device substrate thickness prior to front side processing than thinning a device wafer from the backside after the expense of front-side fabrication has been incurred. Via hole processing can be moved from the backside to the front-side process. The selective etching stops via hole etching at the correct depth and permits one to selectively etch only the bottom wafer during backside processing in the manner as described above. This backside process is robust and results in a high yield manufacturing process. In contrast, without this novel structure and method, precise control during etching would be required to stop etching at the required depth and to remove right amount of backside material.

While the invention has been described with respect to specific embodiments, those skilled in the art will recognize that changes can be made in form and detail without departing from the spirit and scope of the invention. For example, the angle of rotational misalignment between two bonded wafers is preferably as close to the maximum effective rotational misalignment as practical to maximize the benefit of misalignment in strengthening the bonded wafer. However, strengthening wafers using rotational misalignment angles other than the maximum effective rotational misalignment angles also falls in the scope of this invention. Two different III-V semiconductors can be used in bonding. Examples of such materials include GaAs, GaP, GaSb, InP, InAs and InSb. A ternary $Al_xGa_{1-x}As$ alloy etch stop layer is given because it can be grown easily on GaAs and a large number of selective etching chemistries are available. However, other ternary or quaternary alloy layer can be used as etch stops. Examples are $In_{x}Ga_{x}P$ for ternary, and $In_{y}(Al_xGa_{1-x})_{1-y}P$ for quaternary etch stop layers. Because the lattice constant of Ge is very close to GaAs, Ge is a good choice for an etch stop. Accordingly, all such changes come within the invention.

I claim:

1. A method comprising the act of bonding a first III-V semiconductor wafer to a second III-V semiconductor wafer so that the {110} plane of said first III-V semiconductor wafer is displaced at an angle relative to the {110} plane of said second III-V semiconductor wafer, wherein the effective rotational misalignment between said first and second wafers is at or near its maximum effective value.

2. Method of claim 1 wherein said angle of displacement reduces the susceptibility of said first and second semiconductor wafers to breaking.

3. Method of claim 1 wherein said first and second III-V semiconductor wafers are thermally bonded to each other.

4. A method comprising the acts of:

bonding a first III-V semiconductor wafer to a second III-V semiconductor wafer so that the {110} plane of said first III-V semiconductor wafer is displaced at an angle relative to the {110} plane of the second III-V semiconductor wafer;

forming integrated circuits in the first wafer; and then removing the second wafer after said forming.

5. Method of claim 4 wherein said angle of displacement is greater than 5° or less than −5°.

6. A method comprising the act of:

bonding a first III-V semiconductor wafer to a second III-V semiconductor wafer so that the {110} plane of said first III-V semiconductor wafer is displaced at an angle relative to the {110} plane of the second III-V semiconductor wafer; and forming an etch stop layer between said first and second wafers.

7. Method of claim 6 wherein said etch stop layer comprises an elementary or ternary or quaternary semiconductor layer.

8. Method of claim 7 wherein said etch stop layer comprises a material selected from the group consisting of AlGaAs, InGaP, InAlGaP and Ge.

9. Method comprising the acts of:

forming a structure comprising an etch stop layer, a III-V semiconductor wafer on a first side of said etch stop layer, and a second wafer on a second side of said etch stop layer;

forming one or more semiconductor devices in said III-V semiconductor wafer; and removing said second wafer from said structure, at least a portion of said step of removing comprising the act of etching the material of said second wafer from said structure, said etch stop layer stopping said etching process so that said III-V semiconductor wafer is not etched during said act of removing.

10. Method of claim 9 further comprising the act of removing said etch stop layer after said act of removing said second wafer.

11. Method of claim 9 wherein said second wafer comprises III-V semiconductor material.

12. Method of claim 11 wherein the {110} planes of said III-V semiconductor wafer and said second wafer are misaligned.

13. Method comprising:

providing a structure comprising a first etch stop layer, a III-V semiconductor wafer on a first side of said etch stop layer, and a second wafer on a second side of said etch stop layer;

forming one or more semiconductor devices in said III-V semiconductor wafer; and etching a hole through said III-V semiconductor wafer, said etch stop layer preventing said hole from extending past said etch stop layer during said etching.

14. Method of claim 13 further comprising the act of depositing electrically conductive material in said hole, said electrically conductive material being electrically coupled to at least one of said semiconductor devices in said III-V semiconductor wafer.

15. Method of claim 13 further comprising the acts of:

removing said second wafer;

removing said etch stop layer; and coupling said III-V semiconductor wafer to a conductive structure, said conductive material in said hole being electrically coupled to said conductive structure.

16. Method of claim 13 wherein said second wafer comprises a III-V semiconductor material, and the {110} planes of said III-V semiconductor wafer and said second wafer are misaligned.

17. A method comprising:
bonding a first side of a first III-V semiconductor wafer to a second III-V semiconductor wafer so that the {110} plane of said first III-V semiconductor wafer is displaced at an angle relative to the {110} plane of said second III-V semiconductor wafer by an angle; and forming devices on a second side of said first III-V semiconductor wafer that is opposite to said first side of said first III-V semiconductor wafer.

18. Method of claim 17 wherein devices are not formed in said second III-V semiconductor wafer.

19. Method of claim 18 wherein devices are not formed in said first side of said first III-V semiconductor wafer.

20. Method of claim 17 wherein said devices are electrically accessed from said second side of said first III-V semiconductor wafer.

21. Method of claim 17 wherein said devices are transistors that are accessed from said second side of said first III-V semiconductor wafer.

22. Method of claim 21 wherein said transistors are field effect transistors.

23. A method comprising:
bonding a first III-V semiconductor wafer to a second III-V semiconductor wafer so that the {110} plane of said first III-V semiconductor wafer is displaced at an angle relative to the {110} plane of said second III-V semiconductor wafer by an angle to substantially strengthen said fist and second wafers, and render said first and second wafers resistant to fracture.

* * * * *